US007011381B2

(12) United States Patent
Roberts et al.

(10) Patent No.: US 7,011,381 B2
(45) Date of Patent: Mar. 14, 2006

(54) COUNTER TOP TICKET DISPENSER, DISPLAY, AND WRITING STAND

(75) Inventors: Brian J. Roberts, Carlsbad, CA (US); David B. Petch, La Jolla, CA (US)

(73) Assignee: GIECH Corporation, West Greenwich, RI (US)

( * ) Notice: Subject to any disclaimer, the term of this patent is extended or adjusted under 35 U.S.C. 154(b) by 0 days.

(21) Appl. No.: 09/738,234

(22) Filed: Dec. 15, 2000

(65) Prior Publication Data

US 2001/0006181 A1    Jul. 5, 2001

Related U.S. Application Data

(60) Division of application No. 09/394,660, filed on Sep. 13, 1999, and a continuation-in-part of application No. 09/385,336, filed on Aug. 30, 1999, which is a continuation-in-part of application No. 09/238,682, filed on Jan. 26, 1999, now Pat. No. 6,726,077, and a continuation-in-part of application No. 09/128,406, filed on Aug. 3, 1998, now abandoned, and a continuation-in-part of application No. 09/060,423, filed on Apr. 14, 1998, now abandoned.

(51) Int. Cl.
  *B65D 83/12*   (2006.01)
  *B26F 3/02*    (2006.01)

(52) U.S. Cl. .................. 312/34.4; 206/503; 221/45; 221/155; 225/39; 225/41; 463/17

(58) Field of Classification Search ............ 225/39, 225/41, 42, 46, 47; 220/826, 504, 916; 312/34.7, 312/34.4, 34.8, 34.23; 221/45, 46, 61, 62, 221/155, 35; 232/43.4; 206/393, 394, 409, 206/503, 824; 242/590, 594, 594.5, 594.6, 242/594.8, 597.8, 598.5, 598.6; 463/17
See application file for complete search history.

(56) References Cited

U.S. PATENT DOCUMENTS

| 2,482,714 | A | * | 9/1949 | Mell ........................... 225/38 |
| 2,578,115 | A | * | 12/1951 | West ......................... 221/61 X |
| 2,752,106 | A | * | 6/1956 | Thompson ............... 242/422.5 |
| 4,738,384 | A |   | 4/1988 | Tigner ......................... 225/16 |
| 4,858,806 | A |   | 8/1989 | Schafer ....................... 225/32 |
| 4,982,337 | A |   | 1/1991 | Burr et al. .................. 700/235 |
| 4,995,507 | A |   | 2/1991 | Schafer ..................... 206/39.7 |
| 5,131,561 | A | * | 7/1992 | Casperson et al. ............ 221/35 |
| 5,222,644 | A | * | 6/1993 | Moreno ....................... 225/19 |
| 5,305,937 | A | * | 4/1994 | Barnett ..................... 242/594.6 |
| 5,399,005 | A |   | 3/1995 | Schafer ..................... 312/107 |
| 5,449,111 | A | * | 9/1995 | Sauzedde et al. ............. 232/17 |
| 5,492,398 | A |   | 2/1996 | Schafer ..................... 312/34.7 |
| 5,943,241 | A |   | 8/1999 | Nichols et al. ............ 700/232 |
| 5,944,354 | A | * | 8/1999 | Feola .......................... 283/67 |
| 6,056,233 | A | * | 5/2000 | Von Schenk ............. 242/594.5 |

OTHER PUBLICATIONS

Take-A-Ticket, Inc.,#400-U "Ultimate" Take-A-Ticket, Inc. (TAT) Inc. In-Counters!!, "Public Gaming", Jul. 1999.
Ads of Schafer Systems Inc. (p. 37), "Public Gaming", Oct. 1998.

* cited by examiner

*Primary Examiner*—Clark F. Dexter
(74) *Attorney, Agent, or Firm*—Kenyon & Kenyon

(57) ABSTRACT

A relatively tall embodiment of a lottery ticket dispenser with a small footprint is fitted onto the countertop of a check-out counter of a retail store. The dispenser includes a housing, the top of which is flat so as to provide a convenient place for customers to write checks with the tickets being displayed immediately below being highly visible to the customer.

9 Claims, 4 Drawing Sheets

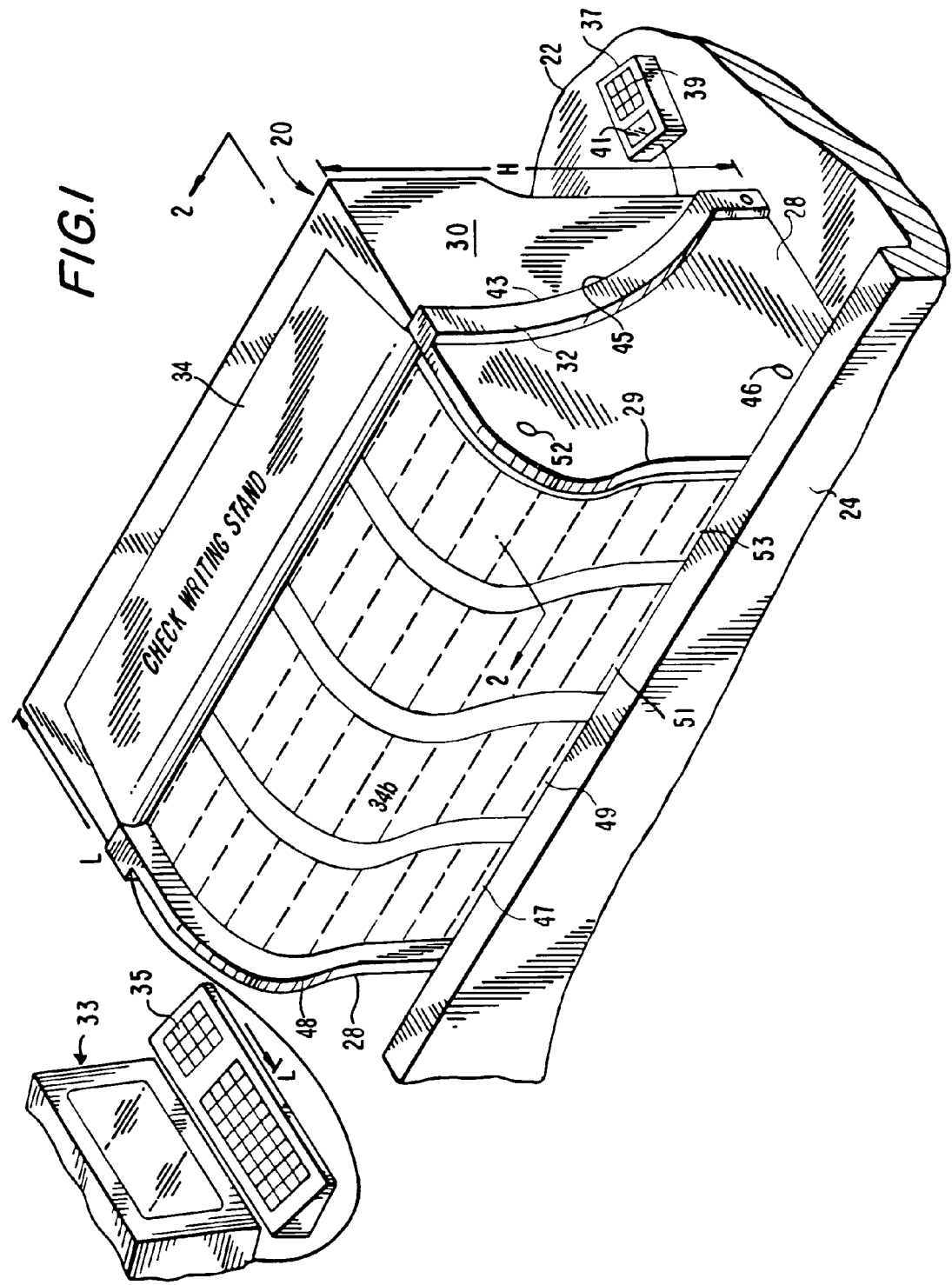

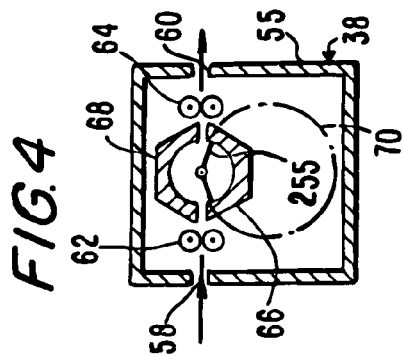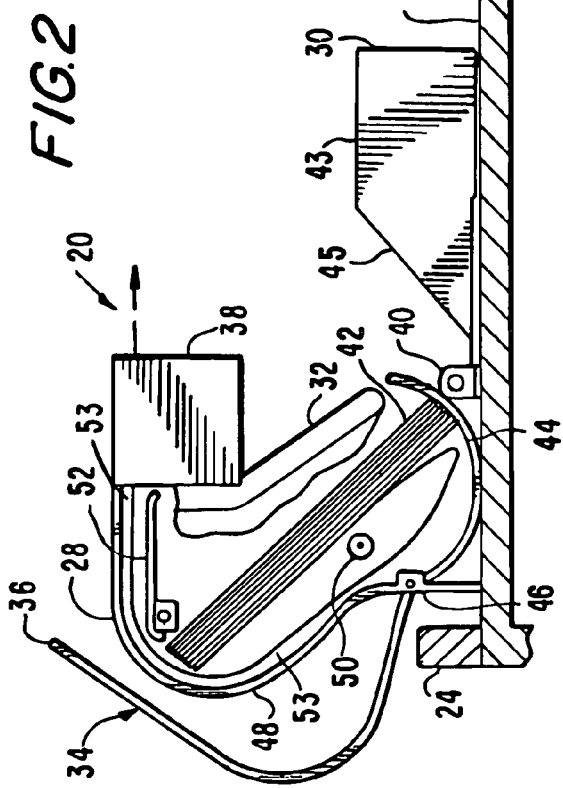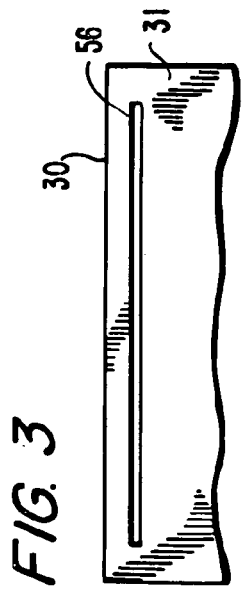

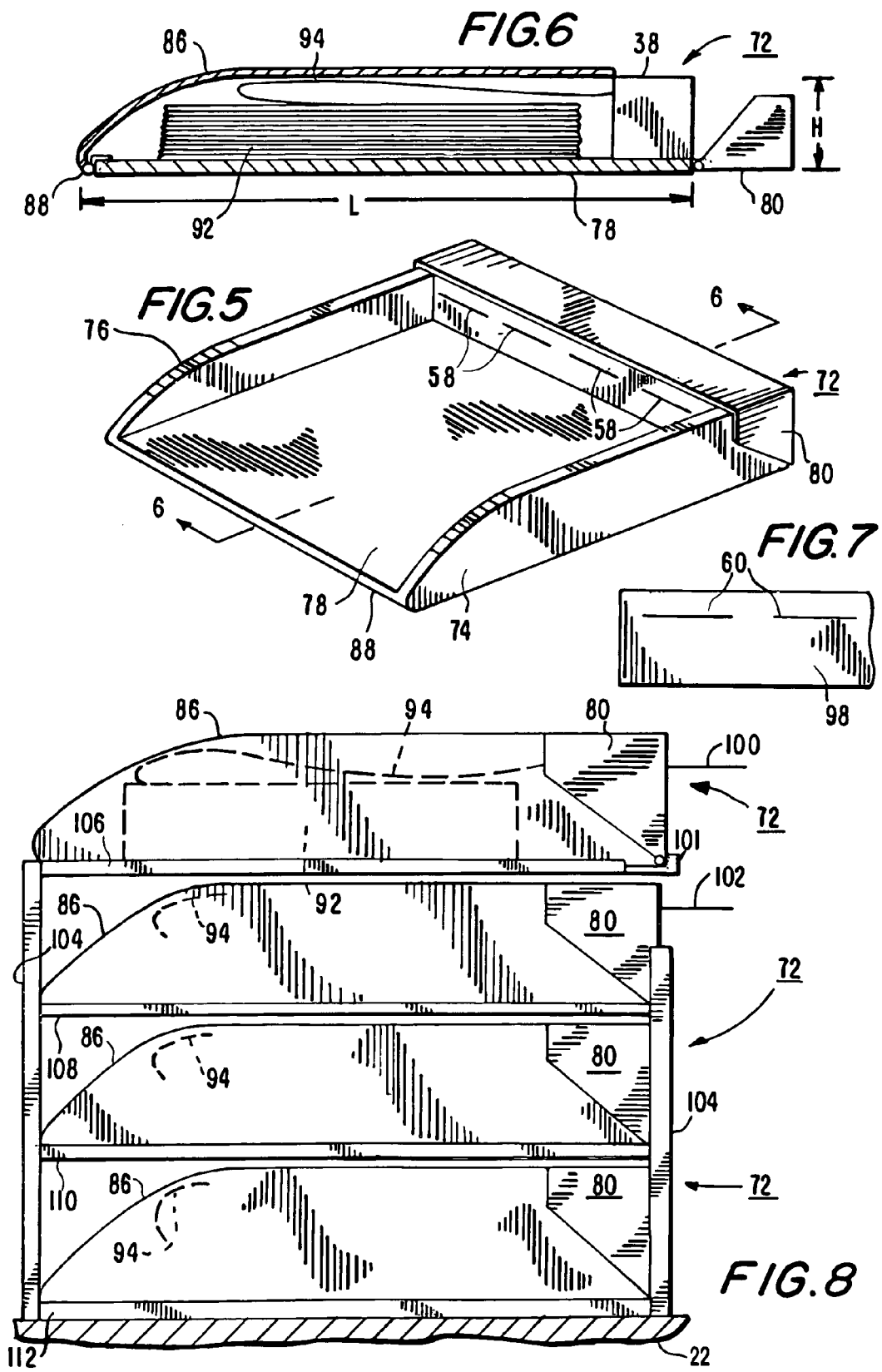

COUNTER TOP TICKET DISPENSER, DISPLAY, AND WRITING STAND

This application is a division of U.S. patent application Ser. No. 09/394,660, filed on Sep. 13, 1999 (pending), which is a continuation in part of U.S. patent application Ser. No. 09/238,682, filed Jan. 26, 1999, now U.S. Pat. No. 6,726,077, of Ser. No. 09/128,406, filed Aug. 3, 1998, now abandoned, and of Ser. No. 09/060,423, filed Apr. 14, 1998, now abandoned, and U.S. patent application Ser. No. 09/385,336, filed Aug. 30, 1999(pending).

This invention relates to ticket dispensers, and particularly to dispensers of lottery tickets joined together in strips in which the tickets are delineated from one another by lines of weakness. In particular, the invention relates to such dispensers from which customers can see and select lottery tickets, and the tickets are dispensed by a store clerk or the customer.

One of the problems with prior lottery ticket dispensers of the type described above is that the dispensers take up a great deal of counter space and thus are in the way if they are placed on or near check-out counters in stores.

Another problem with such dispensers is that, when they are stacked on top of one another, they tend to shift and fall off. Moreover, it is difficult to see the tickets in the dispensers at the bottom of the stack because the customer's view is blocked by the upper dispensers in the stack because the upper dispensers in the stack block the customer's view.

Another problem with prior lottery ticket dispensers of the type described above is that the dispensers do not control the inventory of lottery tickets in the dispenser or account for the tickets sold during the dispensing process.

It is an object of the present invention to provide dispensing devices, installations and displays that eliminate or alleviate the foregoing problems.

In particular, it is an object of the invention to provide a ticket dispenser which is of the size and configuration to make it a welcome addition to a check-out counter.

Another object of the invention is to provide a rack or cabinet for stacking relatively short, wide ticket dispensers; a rack or cabinet that holds the dispensers in a stable stack structure.

A further object of the invention is to provide such a rack or cabinet which laterally staggers the positions of the dispensers relative to one another so that the lower dispensers in the stack are more visible.

It also is an object of the invention to provide a drive and separating module which can be easily mounted in any of the dispenser housings with a minimum of assembly, labor, tools and hardware.

It is a further object of the invention to provide such structures which are robust, relatively inexpensive to manufacture, and relatively easy and efficient to use.

In accordance with the present invention, the foregoing objects are met by the provision of a ticket dispenser which has a housing including a hinged front cover forming the top end portions of the side walls of the housing, and another hinged rear cover forming the rear complementary portions of the side walls of the housing, so that the front cover can be lifted to give access to the ticket storage area, and the rear cover can be rotated away to give access to the dispensing portion of the housing.

Another aspect of the invention is the provision of a rack or cabinet to support a plurality of relatively low and wide dispensers on top of one another so as to keep them stable. It is preferred that the positions of the dispenser housing be staggered laterally so that lower ones of the housing are more visible than if the housings were stacked vertically with respect to one another. It also is preferred that the width of dispensers at the top be less than that of dispensers below so as to align one end of each dispenser vertically with the corresponding ends of the other dispensers.

A check-out counter dispenser is provided which not only occupies relatively little check-out counter space, but also serves a useful function which makes it a desirable addition to the check-out counter. A relatively tall dispenser is provided in which space for storage of the tickets is located underneath a drive module. The stack of tickets to be dispensed is stored at a substantial angle from horizontal. The housing thus has a relatively small footprint and takes up relatively little countertop space.

Preferably, the top of the housing is flat and extends to a height making it a convenient surface upon which a customer can write checks. The tickets to be dispensed are visible through the transparent cover of the housing immediately below the flat top where the check is being written. This increases exposure of the tickets to the customers and promotes sales.

Preferably, each of the different sizes and shapes of housing uses a single drive and separation module which fits into the housing easily and quickly with a minimum of installation labor and hardware being required. The module contains a drive motor and drive rollers for a plurality of different channels, each adapted to drive one strip of tickets. A rotary helical separator mechanism is provided, with a drive motor to rotate it, so as to separate one or more tickets from each strip.

Preferably, the dispensing of the proper number and type of tickets is controlled by a clerk in the store operating a point-of-sale terminal or a computer, preferably a small palm top or similar computer with a keypad. Optionally, the actions performed by the clerk can also be performed by the customer and such computer controller can be mounted in such a location or position to allow dual use by both the clerk and/or the customer, e.g., the computer can be mounted on a swivel mounting.

The foregoing and other objects and advantage of the invention will be set forth in or apparent from the following description and drawings.

IN THE DRAWINGS

FIG. 1 is perspective, partially schematic view of a countertop ticket dispenser installation on check-out counter in a store;

FIG. 2 is a cross-sectional view, taken along line 2—2 of FIG. 1, partially broken away, and showing the housing open instead of closed as in FIG. 1;

FIG. 3 is a front elevation view, partially broken away, of the dispenser shown in FIGS. 1 and 2;

FIG. 4 is a cross-sectional, partially schematic side elevation of the drive and separation module used in the dispenser of FIGS. 1 through 3, as well as in other dispensers described herein;

FIG. 5 is perspective view of a relatively short but wide countertop dispenser in which the tickets are stored laterally of the drive and separation module;

FIG. 6 is a cross-sectional, partially schematic view of the dispenser shown in FIG. 5;

FIG. 7 is a partially broken away front elevation view of the dispenser shown in FIGS. 5 and 6;

FIG. 8 is a side elevation view of a display rack for multiple ticket dispensers of the type shown in FIGS. 5 through 7;

SMALL FOOTPRINT DISPENSER

Figure 9:
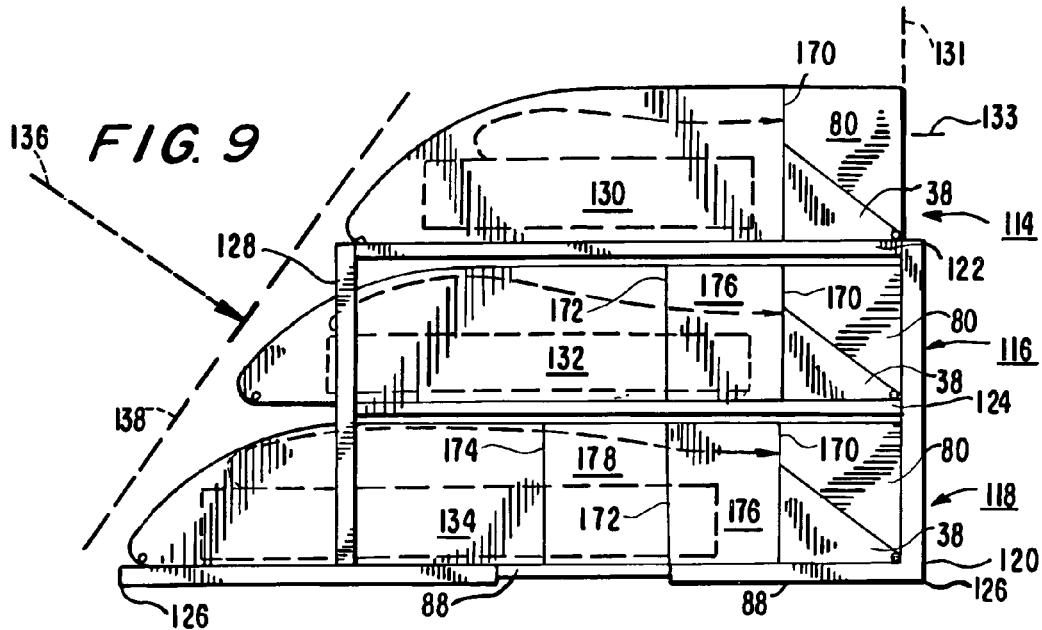
FIG. 9 is a side elevation view of an alternative display of ticket dispensers.

FIG. 1 shows a dispenser 20 mounted on a check-out counter 22 with side rails 24 and 26 in a retail store or supermarket checkout lane. The unit 20 has a particularly small footprint, even though it dispenses instant winner scratch-off type lottery tickets from four different channels and from four relatively wide or long stacks 42 of tickets (see FIG. 2).

The unit 20 includes a pair of side walls 28 made of cast aluminum or other strong, secure material, with a curved portion 29 protruding out over the side-rail 24 of the check-out counter 22, or flush with the front of the counter depending on the installation. The rail 24 is on the side of the counter that is nearest to the normal position of the customer when having his or her purchases checked-out.

The check-out stand includes a point-of-sale terminal or computer 33 with a keyboard 35, or a hand-held computer 37 with a keypad 39 and a display 41. Alternatively, terminal 33 can be an on-line lottery game terminal such as those used to sell lotto and similar games. Any of these input devices can be used to select the type of ticket and quantity of tickets desired by the customer, as described more fully in the disclosure in the above-identified co-pending U.S. patent applications.

The dispensing unit 20 includes a housing with a front cover 34 (see FIG. 2) which is hinged to the housing at 46 so as to fold to the left and away from the interior of the dispenser housing to give access to the interior for replenishing tickets, service, etc.

The housing of the unit 20 also includes hinged rear cover 30 which has a pair of side panels each having a forward edge 43 including a sloping edge 45. The cover 30 is hinged to the housing at 40.

The side walls 28 have an angular reinforcing rib 32 along a portion of the rear edge of the front cover 34. The edges 45 and 43 of the rear cover 30 abut against the ribs 32 when the covers 30, 34 are closed.

When the cover 34 is closed it is seated against a ledge 48 formed around the periphery of each of the side walls 28.

Mounted in the housing is a drive and separation module 38 which pulls a strip of tickets from a supply, separates the number of tickets desired from the strip, and issues them through an outlet opening to the right, as shown in FIG. 2.

Four fan-fold ticket stacks 42 each consisting of a continuous strip of scratch-off lottery tickets or similar tickets is stored in the housing at a location partially below the drive module 38 so as to help minimize the footprint of the dispenser.

Additionally, the footprint is minimized by storing the ticket stacks 42 at a substantial angle to horizontal. This is accomplished by use of a curved support 44 at one end of each stack, and a roller 50 for supporting each stack. The support 44, in essence, serves as a bottom wall for the dispenser housing.

A ticket strip 53 is taken off of the left-hand face of the ticket stack 42, around the roller 50, and upwardly past the upper edge of the stack, and over a curved guide 52 into an inlet opening 58 (See FIG. 4) of the drive unit 38.

The housing has an upper portion that, in the embodiment shown, is formed by an upper portion of the rear cover 30 and an upper portion of the front cover 34, wherein the upper portion of the front cover 34 includes a top portion 34a. As it is shown in FIGS. 1 and 2, the top portion 34a of the front cover 34 of the housing is flat. Since the housing extends vertically by a substantial distance, this flat surface is very convenient to the customer standing at the check-out counter while having his or her purchases checked-out to write on. In particular, it can be used as a check-writing stand.

Preferably, the cover 30 can be locked in place. Preferably, an edge 36 of the cover 34 overlies the edge of the cover 30 so as to lock the housing and prevent unauthorized access.

FIG. 3 is a front elevation view of the rear cover 30 showing its rear wall 31 with a thin slot extending across most of the width of the housing, through which tickets can be dispensed.

Referring again to FIG. 1, four strips of tickets 47, 49, 51 and 53 are stored in the housing. A transparent portion 34b of the front cover 34 allows the customer to clearly see the tickets in the four channels of the dispenser mechanism, whether or not the top is used as a writing surface.

Thus, because of its relatively small footprint, the unit 20 is less obtrusive than prior countertop powered ticket dispensers. Moreover, it is a welcome addition to the check-out counter since its top provides a convenient check-writing surface for the customers' use.

Drive/Separator Module

Drive/separator module 38 is shown schematically in FIG. 4. The module 38 includes a housing 55 with a plurality of inlet openings 58 (FIG. 5), one for each channel of the dispenser. Four sets of input drive rollers 62 and four sets of output drive rollers 64 are provided. Tickets are issued through four outlet slots 60 (See FIG. 7).

As it is described in greater detail in the above-identified co-pending patent applications, a separator mechanism is provided. It is formed by two halves 66 and 68 of a housing which forms a cylindrical interior in which rotates a set of helical separator blades 255, one for every channel, extending from a single shaft. A drive system is indicated by the dashed-circle 70. It includes a single drive motor for selectively driving the drive rollers 62 and 64, and a motor to rotate the helical separator blades 255 to separate tickets from the ticket strips. Further details of this unit will not be described here because of the complete description appearing in the above-identified co-pending patent applications.

Low and Flat Countertop Dispenser

FIGS. 5 through 10 and particularly FIGS. 5 and 6, show a relatively low flat dispenser structure 72.

Whereas the aspect ratio, that is, the ratio of the height H to length L of the dispensing unit 20 shown in FIG. 1 is around 1 or greater, the ratio of H to L in the units 72 is substantially less than 1. The units 72 can be used in areas near the countertop of a check-out area or another counter in a store where there is more space and a larger footprint for the dispenser is acceptable.

The dispenser 72 includes a bottom wall 78, a pair of metal side walls 74 and 76 extending upwardly from the bottom wall 78, a hinged transparent cover 86 which is hinged to the rear edge of the bottom wall 78 by means of a hinge indicated schematically at 88 in FIGS. 5 and 6. The hinged cover 86 is curved in the rear portion so it forms a curved rear wall for the housing, as well as a top cover for the housing.

The housing of the dispensing unit 72 also has a hinged front cover 80 which folds down, as shown in FIG. 6 to allow ready access to the drive module 38. By opening the cover 86, access is given to the interior of the housing for replenishing ticket supplies, etc.

The ticket strip in each of the four channels is pulled back over the top of their respective stacks 92 of tickets and back towards the right where it enters the inlet opening 58 of the drive module 38. By taking this path, the tickets in each strip are very visible to someone viewing the unit from the rear or the left, as it is shown in FIG. 6.

As with the unit 20 shown in FIG. 1, the front cover 80 can be locked with a key lock (not shown), and this is effective to lock the cover 86 as well.

FIG. 8 shows a display rack in which four of the units 72 are stacked one atop the other. The display rack includes vertical members 104 at the four corners of the structure secured to a plurality of horizontal shelves 106, 108, 110 and 112. Preferably, the shelves 106 have an upstanding ridge 101 around the periphery to keep the dispensing units from sliding off.

It should be understood that the display rack is intended to be representative also of a display cabinet which has side walls to further enclose the dispensing units, for better security and/or better appearance.

The vertical members 104 at the corners of the structure can be angles or other suitable metal structural members, and the shelves can be similar structural members and attached to the vertical members. Cross-bracing can be provided as needed.

Tickets 100 and 102 are shown after they have been dispensed and are ready for the clerk to grasp and hand to the customer, who normally stands to the left of the display in FIG. 8.

Staggered Display

FIG. 9 shows a different embodiment of the dispenser display of the invention. Three dispenser units 114, 116 and 118 like or identical to the dispenser 72 are mounted on shelves 122, 124 and 126 of a rack having vertical structural members 120 and 128. The vertical member 128 is spaced laterally to the right of the left edge of the bottom shelf 126. Each of these shelves, as with the shelves of the unit shown in FIG. 8, has a peripheral ridge like the ridge 101 shown in FIG. 8 to minimize the chances of one of the dispensing units falling off of the display.

As shown, the rear walls of each of the units 114, 116 and 118 are staggered relative to one another. That is, the rear wall of the unit 116 is recessed to the right as shown in FIG. 9 relative to the unit 118, and the rear edge of the unit 114 is similarly staggered to the right relative to both units 116 and 118. The rear edges can be staggered along a line of any shape, but in this case are staggered relative to a sloping straight line 138 in FIG. 9.

It also is preferred that each of the three dispensers, 114, 116, and 118 are of different lengths so that the front surfaces of the units will be approximately aligned vertically along a line 131.

The different lengths of the dispenser can be created by adding to the standard length dispenser tray one or more extension pieces of the same length. All extension pieces are identical and secured to one another and/or the standard dispenser tray by means of a mating male and female connector.

This "standard" length dispenser is dispenser 114 shown in FIG. 9. The housing is divided into two sections, one to the left of the vertical line 170, and one to the right of that line. The line 170 is located near the left boundary of the feed and separator module 38. The housings are secured together with tongue-and-groove elements (not shown) which are force-fitted together, or with another suitable fastening arrangement.

To form the larger dispenser 116, an insert 176 forming another section of the housing is fastened between the left and right sections, with suitable fastening means, like those used to fasten the right and left sections together.

Similarly, to form the longest housing 118, a second insert 178 is secured between the left section and the insert 176.

By the foregoing construction, the hinged covers, the left section, the right section and the inserts all can be standardized to ensure economy of manufacture.

As it can be seen, the length of the stack 130 in the top dispenser 114 is shorter than the length of the stacks 132 and 134 in the housing 116 and 118, respectively. However, it should be understood that a short stack of a single size could be used in two or more of the dispensers, depending upon the need.

A ticket 133 is shown protruding from the front face of the dispenser 114 ready for a clerk to grasp it to hand to the customer who is standing to the left of the display.

The display shown in FIG. 9 is particularly advantageous because is maximizes the viewing area of the rear portions of the dispensers when viewed from an angle such as that indicated by the dashed line 136 in FIG. 9.

Figure 10:
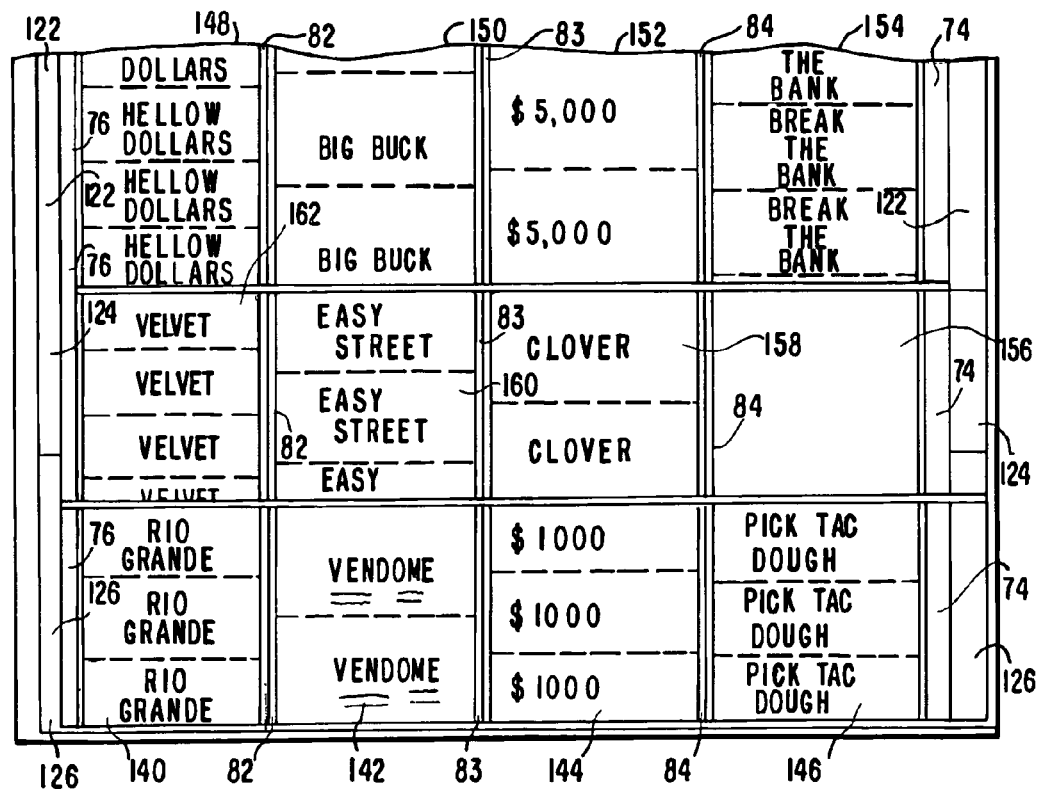
FIG. 10 is a rear elevation view as viewed in the direction of the arrow 136 in FIG. 9.

FIG. 10 is a view, partially broken away of the display of FIG. 9 taken from the angle indicated by the line 136.

The dispenser 114 contains four strips 148, 150, 152 and 154 of tickets. Similarly, the dispenser 118 at the bottom of the stack has four strips of different tickets 140, 142, 144 and 146.

The middle dispenser 116 has only three strips of tickets 158, 160 and 162. The fourth channel 156 is empty.

As it can be seen, from the angle indicated by the arrow 136, a relatively large area of each of the three dispensers is visible. Also, the staggering of the units makes appear as if there is simply one large display consisting of multiple tickets available to the customer. Thus, the customer does not need to bend over and peer intently at an obscure lower or middle dispenser in a dispenser stack, but can readily see the tickets to choose ones he or she desires. This again facilitates attracting buyers and selling tickets.

It also should be understood that the display rack shown in FIG. 9 is intended to be representative of a housing as well which provide more enclosure at the sides and, perhaps at the top so as to make a more attractive and sturdier display.

The above description of the invention is intended to be illustrative and not limiting. Various changes or modifications in the embodiments described may occur to those skilled in the art. These can be made without departing from the spirit or scope of the invention.

The invention claimed is:

1. In combination, a store checkout counter and a countertop ticket display dispenser structure for dispensing tickets, the combination comprising:
   (a) a housing having a front cover, a rear cover, and a ticket dispensing ticket outlet;
   (b) a store checkout counter having a countertop with a customer side for a customer and a clerk side for a clerk;
   (c) said housing further having an upper portion extending between a front of said housing and a rear of said housing, said upper portion including a flat portion for accommodating a typical bank check for said customer to write the bank check on it;

(d) said front cover having a transparent portion through which said tickets can be seen from said customer side, and said ticket dispensing outlet being located on the rear cover; and (e) said housing being mounted adjacent said counter top with said front cover facing said customer side, said rear cover facing said clerk side, and said flat portion accessible to said customer at said customer side of said counter;

wherein the front and rear covers are each hingedly coupled to a remainder of the housing to open outwardly from the remainder of the housing toward said customer side and said clerk side, respectively, and wherein at least a substantial part of the upper portion of said housing is displaceable upon opening of at least one of said front cover and said rear cover to permit access to the inside of the housing.

2. The combination as in claim 1 including structure inside said housing for storing and holding said tickets so as to be visible through said transparent portion, and for guiding said tickets towards said outlet.

3. The combination as in claim 2 wherein said transparent portion is arcuate.

4. The combination as in claim 1 in which said tickets are strip-form gaming tickets, a plurality of strips of said tickets being located and displayed side-by-side in said housing so as to be exposed to the customer through said transparent portion.

5. The combination as in claim 4 further comprising: a plurality of said outlets, one for each of said strips; and guide means for guiding the passage of said strips upwardly adjacent said transparent portion so as to display said ticket strips to said customer as said tickets move towards said outlets.

6. The combination as in claim 1 wherein said front cover has an arcuate portion for guiding said tickets towards said outlet.

7. The combination as in claim 1 wherein said transparent portion is arcuate for guiding said tickets towards said outlet.

8. The combination as in claim 1 wherein said housing is mounted on said countertop.

9. In combination, a store checkout counter and a countertop ticket display dispenser structure for dispensing tickets, the combination comprising:

(a) a housing having a front cover, a rear cover, and a ticket dispensing ticket outlet;

(b) a store checkout counter having a countertop with a customer side for a customer and a clerk side for a clerk;

(c) said housing having a flat portion for accommodating a typical bank check for said customer to write the bank check on it;

(d) said front cover having a transparent portion through which said tickets can be seen from said customer side, and said outlet being located on the rear cover; and (e) said housing being mounted adjacent said counter top with said front cover facing said customer side, said rear cover facing said clerk side, and said flat portion accessible to said customer at said customer side of said counter;

wherein the front and rear covers are each hingedly coupled to a remainder of the housing to open outwardly from the remainder of the housing and permit access to the inside of the housing;

wherein said checkout counter top has an edge at said customer side, and a rail extending above said edge, and in which said transparent portion extends over said rail adjacent said edge.

* * * * *